United States Patent
Zheng et al.

(10) Patent No.: US 10,388,914 B2
(45) Date of Patent: Aug. 20, 2019

(54) PREPARATION METHOD FOR PRINTING OLED DISPLAY

(71) Applicant: Dongguan University Of Technology, Guangdong (CN)

(72) Inventors: Hua Zheng, Guangdong (CN); Lei Yang, Guangdong (CN); Wei Zhang, Guangdong (CN); Lixian Fan, Guangdong (CN); Geng Zhang, Guangdong (CN); Shaoqiang Zhang, Guangdong (CN); Minxia Liu, Guangdong (CN); Chunhua Li, Guangdong (CN)

(*) Notice: Subject to any disclaimer, the term of this patent is extended or adjusted under 35 U.S.C. 154(b) by 0 days.

(21) Appl. No.: 16/011,645

(22) Filed: Jun. 19, 2018

(65) Prior Publication Data

US 2019/0123308 A1    Apr. 25, 2019

(30) Foreign Application Priority Data

Oct. 20, 2017  (CN) .......................... 2017 1 0986812

(51) Int. Cl.
| H01L 51/56 | (2006.01) |
| H01L 51/00 | (2006.01) |
| H01L 51/50 | (2006.01) |
| H01L 51/52 | (2006.01) |

(52) U.S. Cl.
CPC .......... *H01L 51/56* (2013.01); *H01L 51/0005* (2013.01); *H01L 51/5056* (2013.01); *H01L 51/5072* (2013.01); *H01L 51/5092* (2013.01); *H01L 51/5096* (2013.01); *H01L 51/5206* (2013.01); *H01L 51/5221* (2013.01)

(58) Field of Classification Search
CPC . H01L 51/56; H01L 51/5092; H01L 51/5096; H01L 51/5206; H01L 51/0005
See application file for complete search history.

(56) References Cited

U.S. PATENT DOCUMENTS

| 2008/0143251 A1* | 6/2008 | Mathea ............... H01L 51/0019 313/504 |
| 2017/0222190 A1* | 8/2017 | Kwon ................. H01L 27/3211 |
| 2018/0090682 A1* | 3/2018 | Shi ...................... H01L 27/3283 |

* cited by examiner

*Primary Examiner* — Dung A. Le
(74) *Attorney, Agent, or Firm* — Prakash Nama; Global IP Services, PLLC

(57) ABSTRACT

The invention discloses a preparation method for a printing OLED display, comprising the following steps: preparing a hole injection layer, a hole transfer layer or an electron blocking layer on an anodic substrate; forming a soluble fluorine-containing insulation layer with a printing method to encapsulate the whole substrate; performing inkjet printing on the soluble fluorine-containing insulation layer with a fluorine solvent to wash to expose all sub-pixel pits; performing inkjet printing with the solution drops of luminescent materials to form a RGB luminescent layer in the sub-pixel pits; preparing an electron injection layer, an electron transfer layer or a hole blocking layer; preparing a cathode with a printing method or an evaporating method, and finally performing encapsulation to complete the preparation of the single printing OLED display.

10 Claims, 5 Drawing Sheets

| ⑤ Cathode (prepared through printing or evaporating) |
|---|
| ④ Electron injection layer/Electron transfer layer/Hole blocking layer (prepared through printing or evaporating) |
| ③ RGB luminescent layer (prepared through inkjet printing) |
| ② Hole injection layer/Hole transfer layer/Electron blocking layer (prepared through printing or evaporating) |
| ① Anodic substrate (prepared through etching) |

PREPARATION METHOD FOR PRINTING OLED DISPLAY

BACKGROUND OF THE INVENTION

The invention relates to the technical field of OLED displays, and in particular to a preparation method for a printing OLED display.

An organic light-emitting diode (OLED) is an important display technologies, and for a traditional OLED display prepared with a full evaporation process, a fine metal mask (FMM) for evaporation must be used to define RGB sub-pixels, resulting in complex process and high cost. At present, the industry has been actively adopting a printing process (mainly inkjet printing) to prepare the RGB sub-pixels, which is simple in process and low in cost, and the OLED display prepared with this printing-containing process is called as a "printing OLED display". The printing OLED display is substantially characterized by preparing a luminescent layer with the printing process (mainly inkjet printing), and other organic functional layers thereon or thereunder can be prepared either with the printing process (inkjet printing, screen printing, spin coating, spray coating, blade coating, imprinting etc.) or an evaporating process.

The overall structure of pixels of a single printing OLED display is shown in FIG. 1, and in general, the current printing OLED technology is to prepare respective layers ②, ③, ④ and ⑤ in sequence on an anodic substrate ① and complete it with encapsulation finally. The core of the difficult therein is to form a RGB luminescent layer ③ through the inkjet printing, where the solution drops for the inkjet printing are likely to spill and mix mutually, thereby failing the defining of RGB sub-pixels. The reason is that in the prior art, a pixel defining layer on the anodic substrate is restricted by the process during the inkjet printing of the RGB luminescent layer, and the pixel defining layer can hardly meet the requirements of the inkjet printing in the following two aspects: (1) its thickness is difficult to increase to lead to the limited volume of the sub-pixel pits for accommodating the solution drops; and (2) it is difficult to reduce the affinity of its material (polyimide) to the solution drops, resulting in easy diffusion of the solution drops.

BRIEF SUMMARY OF THE INVENTION

To overcome the defects and solve the existing problems in the prior art, the invention provides a preparation method for a printing OLED display, which improves the current inkjet printing process to enable the solution drops for inkjet printing to favorably form a RGB luminescent layer in the sub-pixels in a process of preparing the OLED display.

The invention is implemented with the following technical solution:

a preparation method of a printing OLED display comprises the following steps:

S10, preparing all of or only any one or two of a hole injection layer, a hole transfer layer and an electron blocking layer on an anodic substrate;

S20, forming a soluble fluorine-containing insulation layer with a printing method to encapsulate the whole substrate;

S30, performing inkjet printing on the soluble fluorine-containing insulation layer with a fluorine solvent to wash to expose all sub-pixel pits;

S40, performing inkjet printing with solution drops of luminescent materials to form a RGB luminescent layer in the sub-pixel pits;

S50, preparing all of or only any one or two of an electron injection layer, an electron transfer layer and a hole blocking layer; and S60, preparing a cathode with a printing method or an evaporating method, and finally performing encapsulation to complete the preparation of the single printing OLED display.

Preferably, in Step S10, the hole injection layer, the hole transfer layer or the electron blocking layer is prepared with the printing method or the evaporating method; and the hole injection layer, the hole transfer layer or the electron blocking layer has the thickness of 5-100 nm.

Preferably, in Step S20, the printing method comprises an inkjet printing method, a screen printing method, a spin coating method, a spray coating method, a blade coating method or an imprinting method.

More preferably, the soluble fluorine-containing insulation layer has the thickness of 50-2000 nm; and the RGB luminescent layer has the thickness of 20-200 nm.

Preferably, the fluorine solvent is perfluoroalkanes, perfluorodialkylethers or perfluorotrialkylamines.

Preferably, in Step S50, the electron injection layer, the electron transfer layer or the hole blocking layer has the thickness of 1-50 nm.

Preferably, in Step S60, the cathode is a metallic cathode, and metal in the metallic cathode is Al or Ag.

According to the preparation method for the OLED display provided by the invention, an improvement is made to the inkjet process for the RGB luminescent layer, and by adding a soluble fluorine-containing insulation layer on the substrate, the solution drops for inkjet printing can favorably form the RGB luminescent layer in the sub-pixel pits, thereby greatly improving the production yield for the printing OLED display.

BRIEF DESCRIPTION OF THE DRAWINGS

FIG. 1 is a schematic diagram of a structure of a single OLED pixel in the prior art.

DETAILED DESCRIPTION OF THE INVENTION

To facilitate the understanding of those skilled in the art, the invention will be further illustrated in details below in conjunction with the accompanying drawings and particular embodiments.

Figure 2:
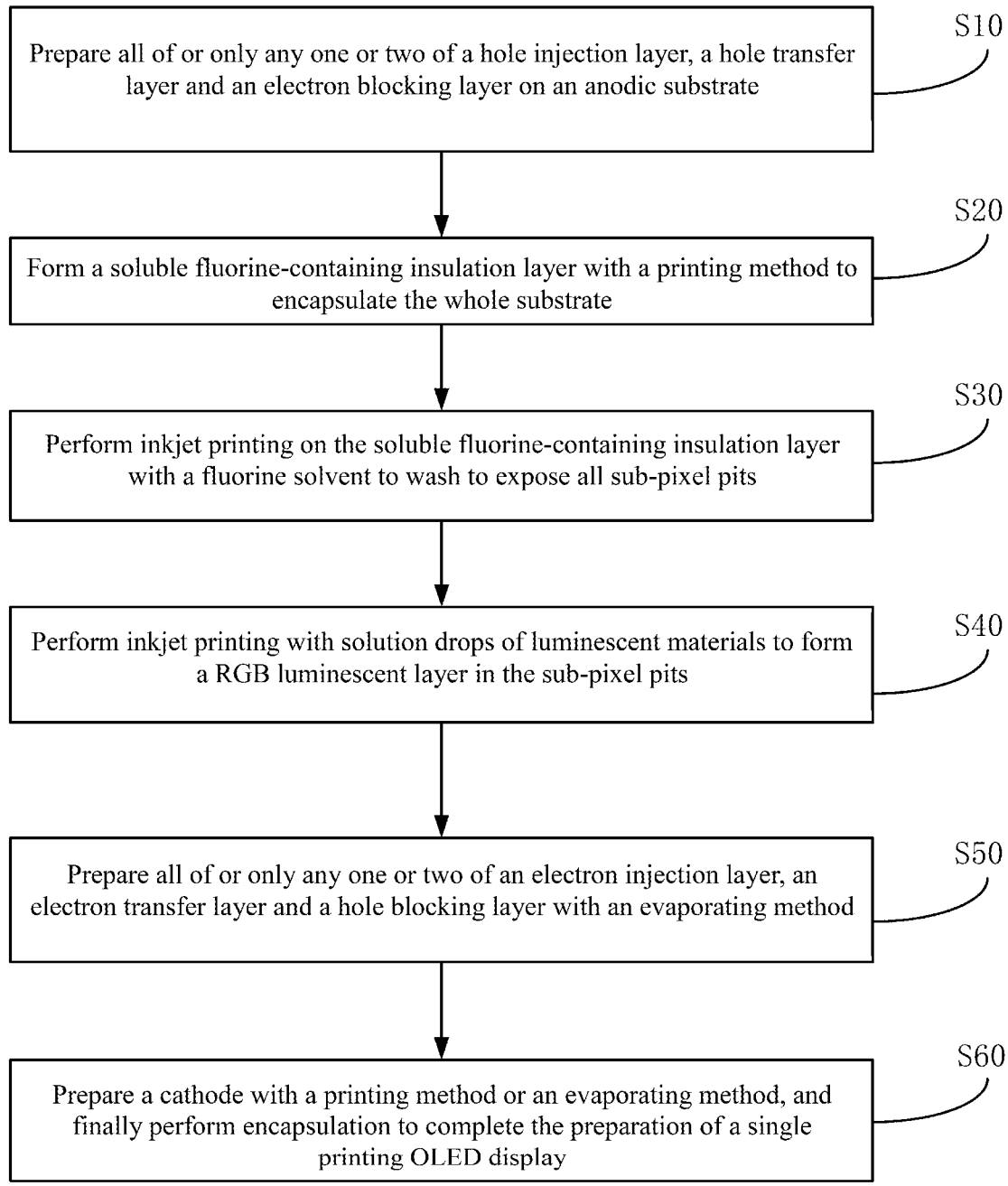
FIG. 2 is a schematic flowchart of a preparation method described in an embodiment of the invention.

As shown in FIG. 2, a preparation method for a printing OLED display comprises the following steps.

S10. Prepare all of or only any one or two of a hole injection layer, a hole transfer layer and an electron blocking layer on an anodic substrate, where the selection on the specific layer(s) to be prepared is made according to actual needs;

moreover, the hole injection layer, the hole transfer layer or the electron blocking layer can be prepared with a printing method or an evaporating method, and the hole injection layer, the hole transfer layer or the electron blocking layer has the thickness preferably of 5-100 nm.

Figure 3:
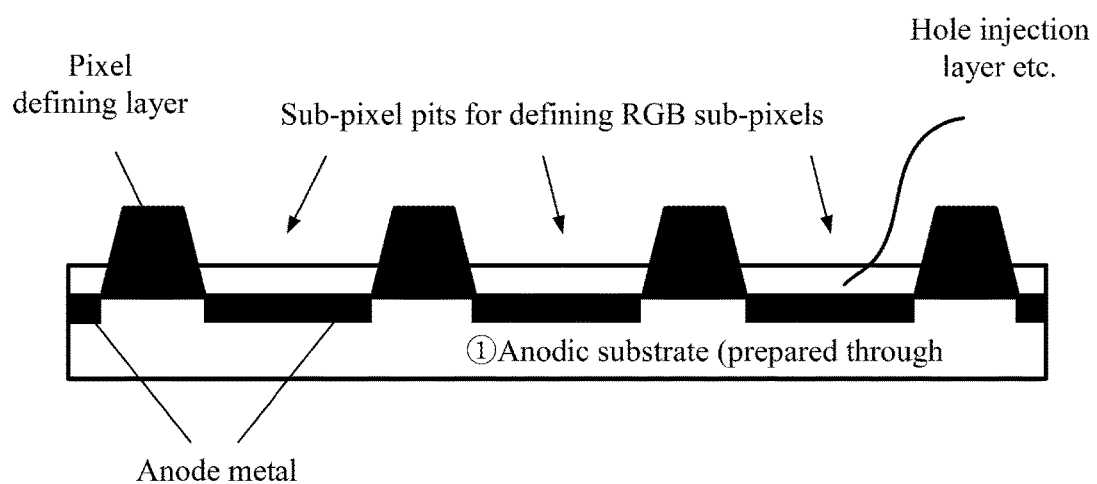
FIG. 3 to FIG. 8 are schematic diagrams of brief structures for preparing an OLED display as described according to steps S10 to S60 respectively.

For instance, the printing method (inkjet printing, screen printing, spin coating, spray coating, blade coating, imprinting etc.) can be applied to the anodic substrate to prepare a polymer hole transfer layer (such as PEDOT:PSS) with the thickness of 10-100 nm; or a vacuum thermal evaporating method can be applied to the anodic substrate to prepare a micro-molecular hole injection layer (such as CuPc or HAT-CN) with the thickness of 5-100 nm. Moreover, the anodic substrate is provided with anode metal, a pixel defining layer, and sub-pixel pits, as shown in FIG. 3. The anodic substrate in this embodiment is prepared through etching and has a structure pertaining to the prior art.

Figure 4:
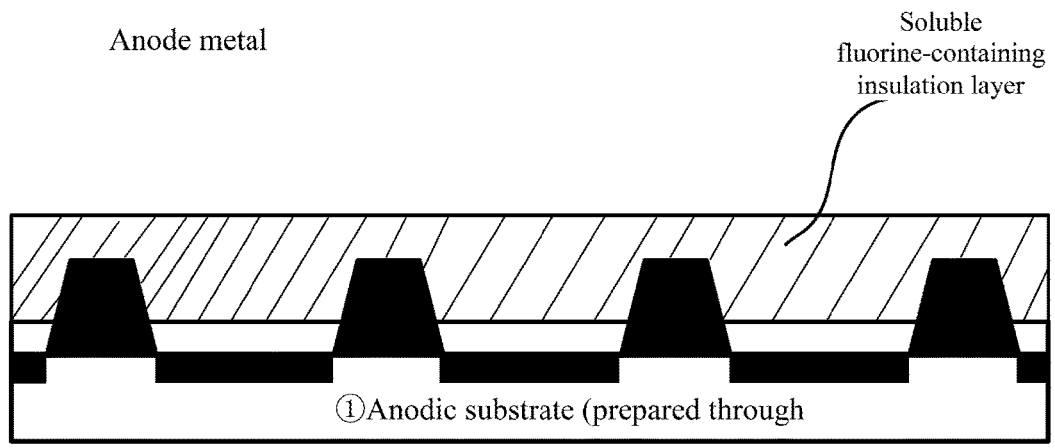

S20. Form a soluble fluorine-containing insulation layer with a printing method to encapsulate the whole substrate, as shown in FIG. 4.

In this embodiment, the printing method comprises an inkjet printing method, a screen printing method, a spin coating method, a spray coating method, a blade coating method or an imprinting method. The soluble fluorine-containing insulation layer (such as CYTOP) has the thickness preferably of 50-2000 nm.

Figure 5:
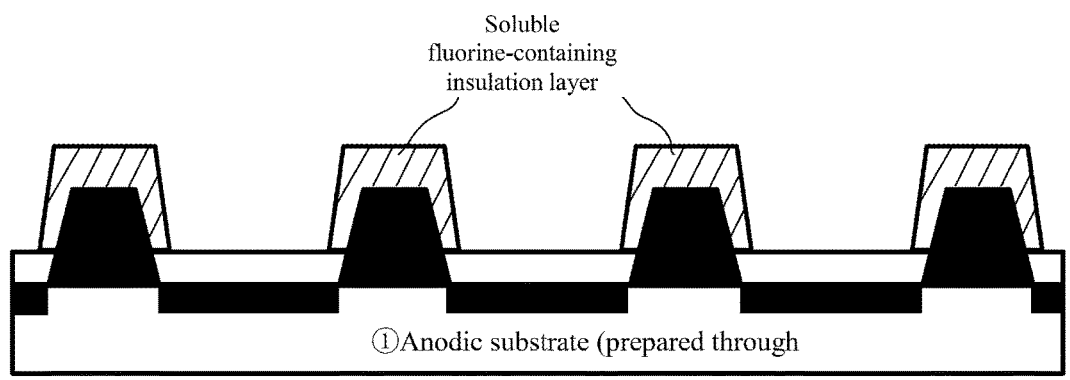

S30. Perform inkjet printing on the soluble fluorine-containing insulation layer with a fluorine solvent to wash to expose all sub-pixel pits, as shown in FIG. 5.

In this embodiment, the soluble fluorine-containing insulation layer has the thickness preferably of 50-2000 nm; and the fluorine solvent is perfluoroalkanes, perfluorodialkylethers or perfluorotrialkylamines.

Figure 6:
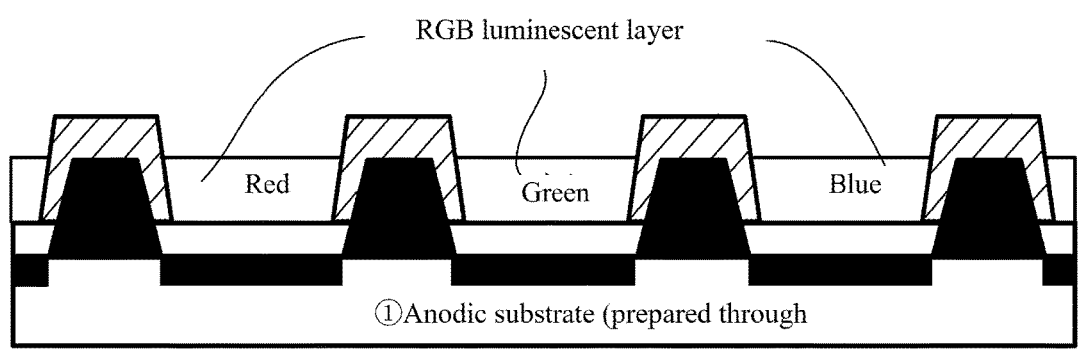

S40. Perform inkjet printing with solution drops of luminescent materials to form a RGB luminescent layer in the sub-pixel pits, as shown in FIG. 6.

For instance, the sub-pixel pits can be subjected to inkjet printing with the solution drops of red (such as PFO-DHTBT), green (such as P-PPV) and blue (such as PF-FSO) luminescent materials in sequence to allow a RGB luminescent layer to be formed in the sub-pixel pits, where the solvents for the solutions are organic solvents (such as ethanol, toluene, chlorobenzene, cyclohexane etc.). Since the soluble fluorine-containing insulation layer covers the original pixel defining layer, that is, the original pixel defining layer is increased in thickness and decreased in surface energy, the solution drops can be stably limited within the sub-pixel pits without spilling, thereby favorably overcoming the defect that the defining of the RGB sub-pixels is failed due to the solution drops for inkjet printing are easy to spill and mix mutually in the prior art. Furthermore, the reasons for choosing the organic solvents as the solvents for the solutions is that the "soluble fluorine-containing insulation layer" is only soluble in the fluorine-containing solvent but insoluble in the common organic solvents, therefore, the soluble fluorine-containing insulation layer will not be affected by the solution drops of the luminescent materials. In this embodiment, the RGB luminescent layer formed in the sub-pixel pits after the solution drops are dried has the thickness of 20-200 nm.

Figure 7:
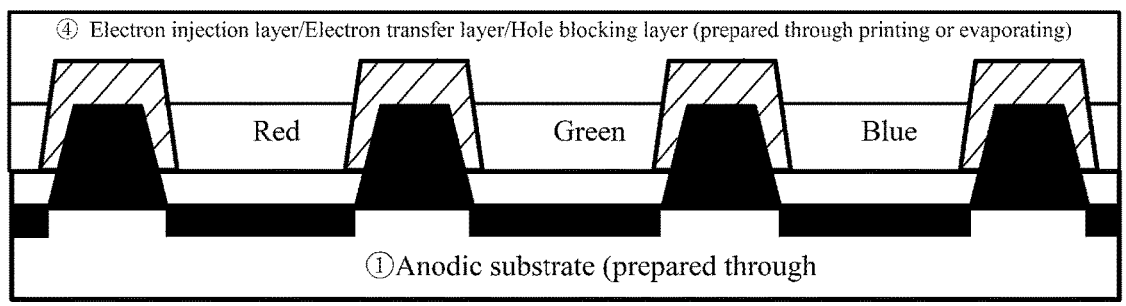

S50. Prepare all of or only any one or two of an electron injection layer, an electron transfer layer and a hole blocking layer, as shown in FIG. 7.

In this step, the electron injection layer, the electron transfer layer or the hole blocking layer has the thickness preferably of 1-50 nm, and preferably, the printing method (inkjet printing, screen printing, spin coating, spray coating, blade coating, imprinting and other methods) or the evaporating method (such as vacuum thermal evaporating) is preferably used to prepare the electron injection layer, the electron transfer layer or the hole blocking layer.

For example, the polymer electron transfer layer (such as PFNR2) with the thickness of 1-50 nm can be prepared on the substrate with the printing method; or the micro-molecular electron transfer layer (such as Alq3) and the electron injection layer (such as LiF), with the thickness of 1-40 nm, can be prepared on the substrate with the vacuum thermal evaporating method.

Figure 8:
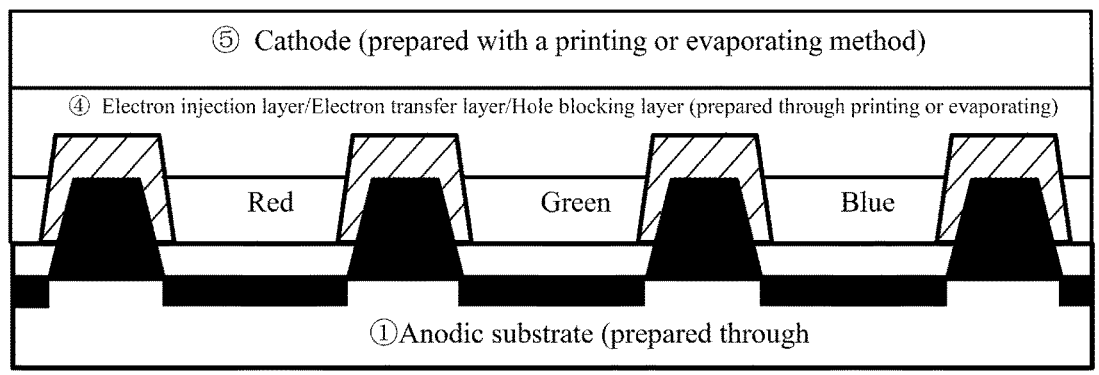

S60. Prepare a cathode with a printing method or an evaporating method, and finally perform encapsulation to complete the preparation of the single printing OLED display, as shown in FIG. 8.

In this step, the cathode is a metallic cathode, and metal in the metallic cathodes is preferably Al or Ag. For instance, the substrate can be printed (through inkjet printing, screen printing, spin coating, spray coating, blade coating, imprinting) with conductive paste (such as micron sliver paste, nano silver ink etc.) and then dried and sintered to obtain a conductive cathode with the thickness preferably of 200 nm-2 mm; or the metallic cathode (such as Al or Ag) with the thickness preferably of 50 nm-2 um can be prepared on the substrate through vacuum thermal evaporating.

For the pixel defining layer in the current printing OLED process, the sub-pixel pits are formed by etching a polyimide material at present, since it is difficult to increase the thickness of the pixel defining layer (that is, the depth of the sub-pixel pits is limited) and the surface energy of the pixel defining layer is high (with better affinity to a solution), phenomena such as the spilling and mutual mixing of the solution drops of the luminescent materials may easily occur during printing, leading to incorrect formation of the luminescent layer for the RGB sub-pixels. However, the invention has made optimization and improvement with respect to the problems described above in the prior art as follows: a whole anodic substrate is first printed with a soluble fluorine-containing insulation layer and then subjected to inkjet printing with a dedicated fluorine solvent to wash to expose the sub-pixel pits, which is equivalent to covering one fluorine insulation layer on the original pixel defining layer; and by adding the soluble fluorine-containing insulation layer, the depth of the sub-pixel pits is increased, moreover, the surface energy of the soluble fluorine-containing insulation layer is very low (more hydrophobic to the solution), therefore, the solution drops of the luminescent materials may not spill during printing to favorably form the RGB luminescent layer in the sub-pixel pits, thereby greatly improving the production yield of the printing OLED display.

The embodiments described above are preferable implementations of the invention, instead of imposing any limits to the invention. Any apparent substitutions are construed to fall within the protection scope of the invention without departing from the inventive conception of the invention.

What is claimed is:

1. A preparation method for printing an organic light-emitting diode (OLED) display, comprising the following steps:
    S10, preparing all of or only any one or two of a hole injection layer, a hole transfer layer and an electron blocking layer on an anodic substrate provided with sub-pixel pits;
    S20, forming a soluble fluorine-containing insulation layer with a printing method to encapsulate the whole substrate;
    S30, performing inkjet printing on the soluble fluorine-containing insulation layer with a fluorine solvent to wash to expose all sub-pixel pits;
    S40, performing inkjet printing with solution drops of luminescent materials to form a Red-Green-Blue (RGB) luminescent layer in the sub-pixel pits;

S50, preparing all of or only any one or two of an electron injection layer, an electron transfer layer and a hole blocking layer; and S60, preparing a cathode with a printing method or an evaporating method, and finally performing encapsulation to complete the preparation for printing the OLED display.

2. The preparation method according to claim 1, characterized in that in Step S10, the hole injection layer, the hole transfer layer or the electron blocking layer is prepared by inkjet printing, screen printing, spin coating, spray coating, blade coating, imprinting, or vacuum thermal evaporating.

3. The preparation method according to claim 2, characterized in that the hole injection layer, the hole transfer layer or the electron blocking layer has the thickness of 5-100 nm.

4. The preparation method according to claim 1, characterized in that in Step S20, the printing method comprises an inkjet printing method, a screen printing method, a spin coating method, a spray coating method, a blade coating method or an imprinting method.

5. The preparation method according to claim 4, characterized in that the soluble fluorine-containing insulation layer has the thickness of 50-2000 nm.

6. The preparation method according to claim 1, characterized in that the fluorine solvent is perfluoroalkanes, perfluorodialkylethers or perfluorotrialkylamines.

7. The preparation method according to claim 6, characterized in that the RGB luminescent layer has the thickness of 20-200 nm.

8. The preparation method according to claim 6, characterized in that in Step S50, the electron injection layer, the electron transfer layer or the hole blocking layer has the thickness of 1-50 nm.

9. The preparation method according to claim 6, characterized in that in Step S60, the cathode is a metallic cathode.

10. The preparation method according to claim 9, characterized in that metal in the metallic cathode is Al or Ag.

* * * * *